United States Patent [19]
McCaslin

[11] Patent Number: 5,933,091
[45] Date of Patent: Aug. 3, 1999

[54] REMOTELY-ACTUATED INFRARED-SENSITIVE SWITCH

[76] Inventor: Robert E. McCaslin, 1227 Coldwater Canyon, Beverly Hills, Calif. 90210

[21] Appl. No.: 08/695,399

[22] Filed: Aug. 12, 1996

[51] Int. Cl.⁶ .................................................. H04Q 1/00
[52] U.S. Cl. ...................... 340/825.72; 359/142; 439/642
[58] Field of Search .................... 340/825.69, 825.72; 359/142; 439/642

[56] References Cited

U.S. PATENT DOCUMENTS

| | | | |
|---|---|---|---|
| 4,262,365 | 4/1981 | George | 359/142 |
| 4,632,490 | 12/1986 | Von Gunten | 439/642 |
| 4,712,105 | 12/1987 | Kohler | 340/825.69 |
| 4,935,733 | 6/1990 | Munekata | 340/825.72 |
| 5,099,193 | 3/1992 | Moseley | 340/825.72 |

FOREIGN PATENT DOCUMENTS 9201968  2/1992  WIPO ............................... 340/825.69

Primary Examiner—Brian Zimmerman
Attorney, Agent, or Firm—Don L. Carnegie; Terrell P. Lewis

[57] ABSTRACT

An infrared-sensitive switching apparatus for use with typical household electic appliances, and an adaptor for supporting the switching apparatus. In one application, the apparatus is used with a lamp, and the adaptor includes a first housing member configured as a female socket for receiving and making electrical contact with a conventional light bulb base, a second housing member configured as a male lamp base which can screw into and make electrical contact with a conventional lamp socket, and a sensor assembly. The sensor assembly includes a photodiode, a power supply, an infrared amplifier, and an ASIC (Application Specific Integrated Circuit). The sensor assembly electrically couples the first and second housing members. The ASIC includes a rectifying circuit, a filter circuit, a switching circuit, and a current-limiting circuit between the filter circuit and the switching circuit. The switching circuit generates a regulated pulsed, high frequency, current at predetermined intervals.

16 Claims, 2 Drawing Sheets

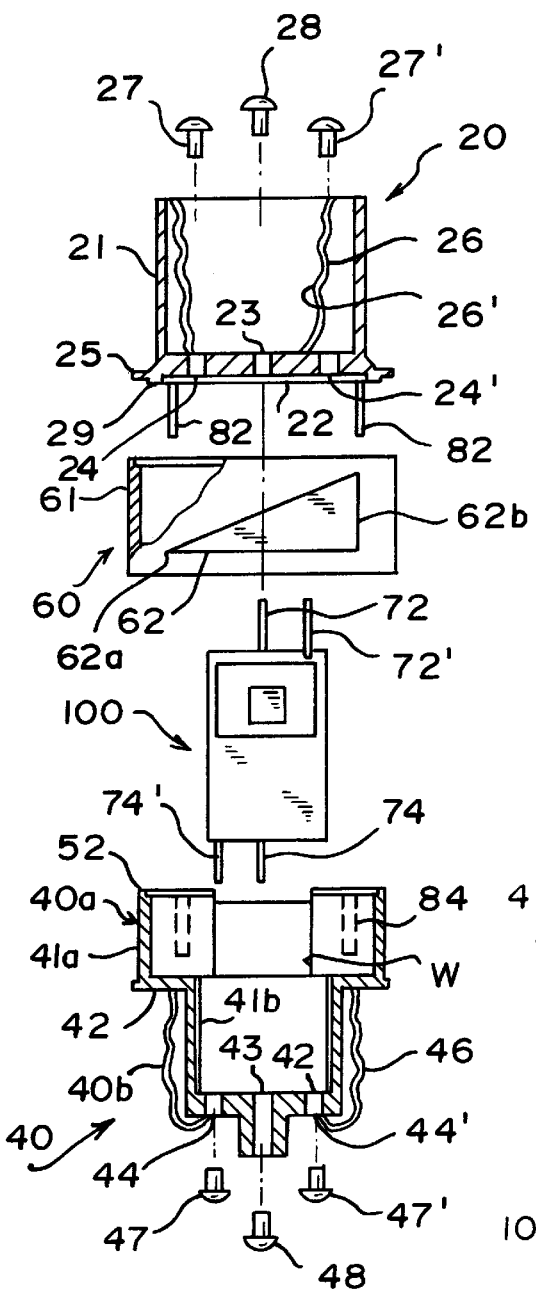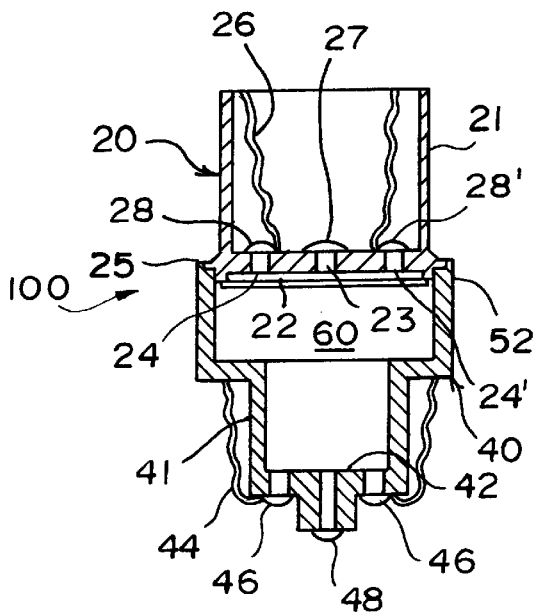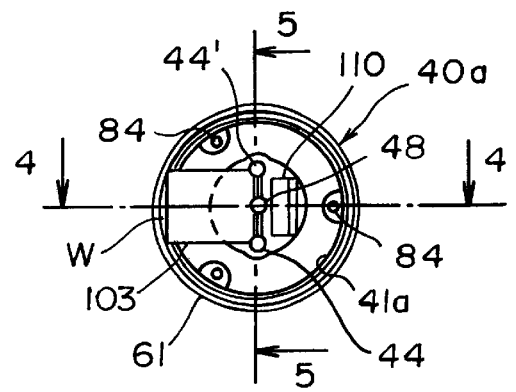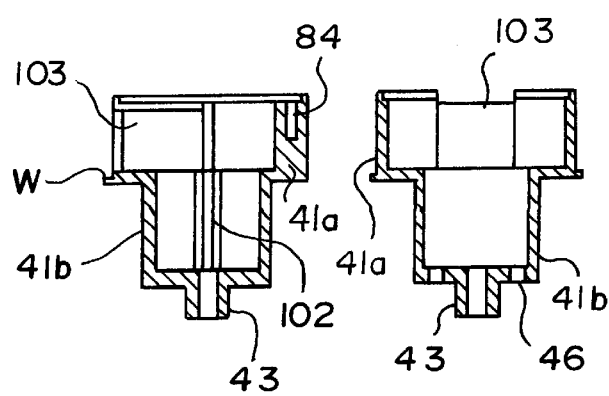
FIG. 1
FIG. 2
FIG. 3
FIG. 4  FIG. 5

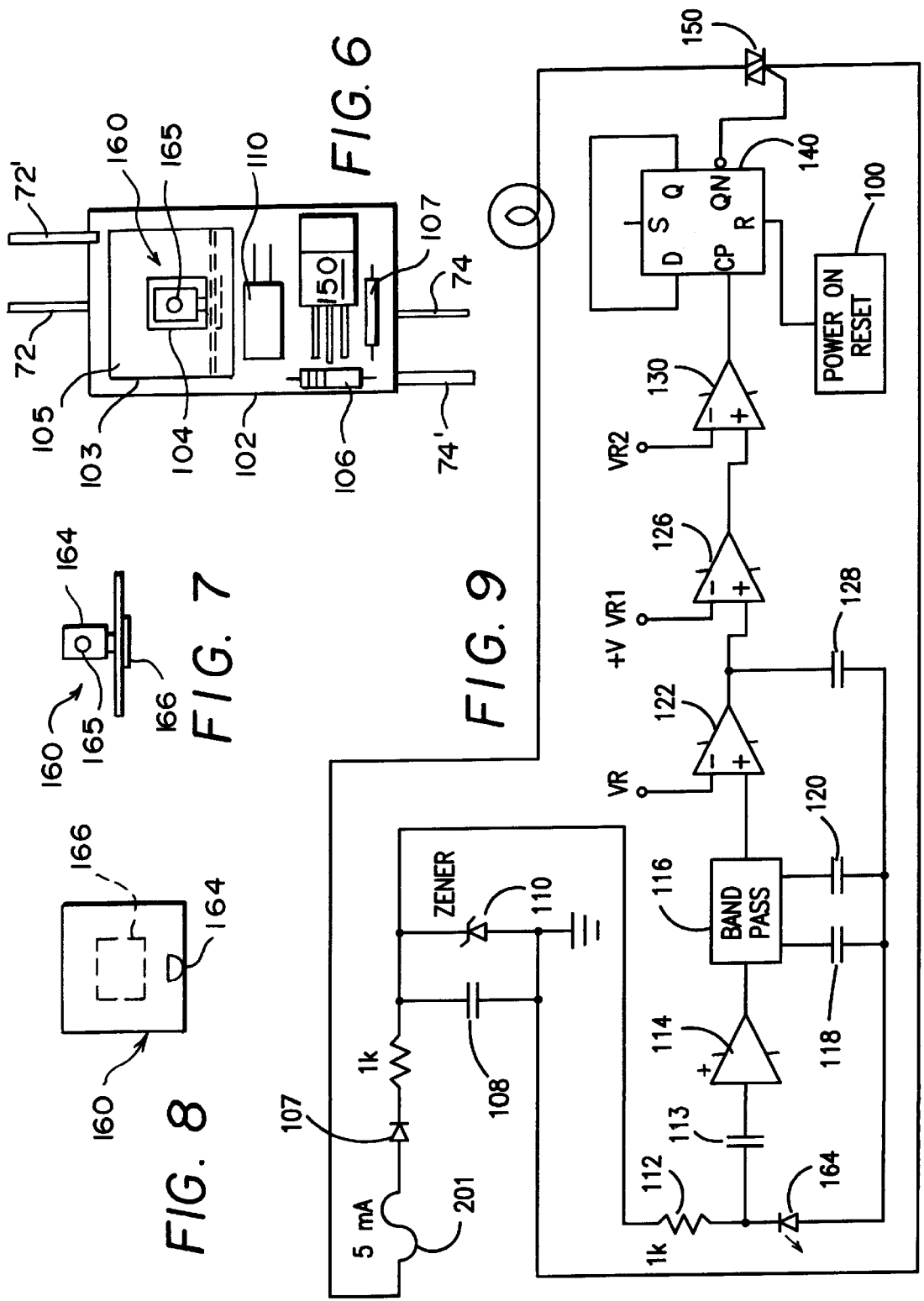

REMOTELY-ACTUATED INFRARED-SENSITIVE SWITCH

BACKGROUND OF THE INVENTION

1. Field of the Invention

The present invention relates to infrared-sensitive remote control devices for activating electronic appliances, and more particularly to an infrared-sensitive, remote control switching unit housed in an adaptor structure for use with an electric appliance for using infrared signals received from a conventional hand-held infrared transmitter unit to switch the appliance start circuit between "on" and "off" states.

2. Description of the Related Art

Infrared remote control systems are well-known in the art. Systems of this kind are used to control television sets, stereo systems, garage door openers, and many other home appliances. They are also used to control electric lamps, as evidenced by U.S. Pat. No. 5,349,330 to Diong et al., and U.S. Pat. No. 5,455,487 to Mix et al.

U.S. Pat. No. 5,349,330 discloses a programmable lamp which includes a passive infrared motion detector, a photo-cell and various sensors through which the lamp can be activated.

U.S. Pat. No. 5,455,487 to Mix et al. discloses a system for controlling power to an electrical load, such as a bank of lights. The system includes a portable detector and a wall-mounted receiver unit. The portable detector determines the presence of a human in a room and the ambient light level and sends a signal to the receiver unit to supply or withhold power to the load.

Nevertheless, even with such sophisticated development, remote control technology has many drawbacks, including high cost of production, and high sensitivity to spurious radio transmission signals.

Against this background, the present invention has been developed to provide a simple, efficient and inexpensive mechanism for operating a conventional lighting system from remote locations by the transmission of infrared signals from a conventional transmitting unit to a receiver unit located in the lighting system.

OBJECTS AND SUMMARY OF THE INVENTION

It is therefore an object of the present invention to provide a remote controlled infrared-sensitive receiver unit for electric appliances which will overcome the deficiencies and drawbacks of other currently known control systems for electric appliances.

Another object of the present invention is to provide a remotely-controlled infrared sensitive switching unit for lighting appliances which will detect an actuating signal emitted from any conventional hand-held infrared transmitter, such as those used to switch channels or control volume on a television set.

Another object of the invention is to provide a circuit including an infrared photodetector for determining whether received infrared signals have a predetermined frequency range that will initiate switching to cause activation and inactivation of the circuit.

Another object of the present invention is to provide a remotely-controlled infrared-sensitive switching unit for use in a conventional lamp which will respond to a range of infrared signals from a conventional television transmitter that are not directly aimed at the receiver unit.

Still another object of the invention is to provide light switching apparatus that can discriminate between signals from a transmitter for changing channels and signals for turning the light "ON" and "OFF" so that unintended operation of the adaptor can be prevented.

Yet another object of the invention is to provide a device sensitive enough to detect signals through a lamp shade or out of the direct line of sight of the transmitter.

Yet another object of the invention is to provide a device that will respond to any signal of the transmitter generated by any button on the transmitter.

These and other objects are attained by the infrared-sensitive receiver unit of the present invention which is housed in a light bulb adaptor assembly. The assembly includes an upper housing member configured as a female socket for receiving a conventional light bulb base, and a lower housing member configured as a male lamp base. The base of the lower member screws into a conventional lamp socket. The female socket of the upper housing member is adapted to receive a standard light bulb. A photodiode, a power supply, an infrared amplifier, and an analog ASIC (Application Specific Integrated Circuit) are all contained within the lower housing member.

The ASIC reduces the total part count for the basic adapter to only a few components, and includes a rectifying circuit, a filter circuit, a switching circuit, and a current-limiting circuit between the filter circuit and the switching circuit. The switching circuit generates a regulated pulsed, high frequency, current at predetermined intervals. A ring rotatable about the lower housing member includes a window of varying area so that as the ring is rotated, the amount of light admitted to the photodiode can be varied.

BRIEF DESCRIPTION OF THE DRAWINGS

FIG. 1 is an exploded view of the components which form the adapter assembly of the present invention;

FIG. 2 is a cross sectional view of the adapter assembly of the present invention, when assembled;

FIG. 3 is a top view of the lower housing member of the adapter assembly;

FIG. 4 is a first sectional view of the lower housing member of the adapter assembly taken in the direction of the arrows 4—4 shown in FIG. 3;

FIG. 5 is a second sectional view of the lower housing member of the adapter assembly taken in the direction of the arrows 5—5 shown in FIG. 3;

FIG. 6 is a perspective view of the sensor assembly 100 depicted in FIG. 1;

FIG. 7 is a side view of various components of which the sensor assembly is comprised;

FIG. 8 is a top view of the the arrangement of components shown in FIG. 7; and

FIG. 9 is a diagram of the circuit carried by the ASIC shown in FIGS. 7 and 8.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Operational characteristics, attributed to forms of the invention first described, also shall be attributed to forms later described, unless such characteristics obviously are inapplicable or unless specified exception is made.

Referring now to FIGS. 1–5, the adapter assembly 10 of the present invention is seen to include an upper housing member 20, a lower housing member 40, and an annular member 60 carried by an upper portion of the lower housing member. The annular member 60 is shown in partial section. A sensor assembly 100 (see FIGS. 6–8) is mounted inside the adapter assembly between the upper and lower housing members for electrically connecting the upper and lower housing members (as described in greater detail below).

The upper housing member 20 includes a cylindrical portion, preferably made of insulating material, having a side wall 21 and a base 22. The base includes a central hole 23 and two additional holes 24, 24' located on diametrically opposite sides of the central hole 23. An annular flange 25 is formed on the exterior of the base 22. A metal shell 26 is disposed within the housing, and extends from the upper region of the upper section 20 to the upper surface of the base 22. The shell 26 is provided with a helically grooved interior surface 26' configured for receiving the base of a conventional light bulb which is to be screwed into the shell in a conventional manner.

The invention also contemplates that the shell 26 may comprise a cylindrical member made of a material such as ceramic or plastic that exhibits a helical groove on its interior surface, where the interior surface is plated with metal. Rivets or similar fasteners 27, 27' and 28, having elongated hollow tubular portions, are secured in holes 24, 24' and 23, respectively. An annular rim 29 extends downwardly from the base 22 (the purpose of which will be described below).

The lower housing member 40 includes a cylindrical portion, preferably made of an insulating material such as plastic or ceramics, is formed with a first, upper, section 40a having a first inner diameter and a second, lower, section 40b having a second inner diameter smaller than the first inner diameter. Each of the first and second sections of the lower housing member includes a side wall 41a and 41b, respectively. The lower housing member 40 also includes an annular wall 42 that extends normal to the two side walls 41a and 41b and divides the first section 40a from the second section 40b.

An annular base 42' is provided at the lower end of the second section 40b. The base 42 includes a central hole 43 and two other holes 44, 44' disposed on diametrically opposite sides of the central hole 43. Rivets (or the like) 47, 47' and 48, having elongated hollow tubular portions, are secured in holes 44, 44' and 43, respectively. An annular shoulder 52 having an upwardly facing surface is formed on the upper end of the side wall 41. The annular shoulder 52 supports the flange 25, and the inner circumferential surface of the shoulder 52 frictionally engages the outer circumferential surface of the annular rim 29, when the upper and lower housing members are assembled.

FIG. 1 shows a metal shell 46 is disposed about the second section of the housing, and extends from the base 42' to the annular wall 42 that divides the first and second housing sections. The shell 46 is provided with a threaded exterior surface to allow it to be threaded into and secured within a conventional lamp socket. Within the scope of the invention, it is also possible to form the exterior surface of the lower section wall 41b with a helical groove, and plate the groove with a conductive (preferably metallic) material.

The annular member 60 is mounted on the upper section 40a of the lower housing member 40, and has a diameter which is slightly greater than the diameter of the upper section 40a. The annular member 60 is supported for rotation by the upper section 40a about the longitudinal axis L—L of the adapter assembly.

Preferably, the member 60 and the outer surface of the upper section are provided with a conventional key and keyway of limited circumferential extent (not shown), to define a mechanism for limiting rotational movement of the annular member 60 about the exterior of the upper section. The annular wall 61 of the member 60 is preferably formed of an opaque material which prevents the passage of infrared signals. The wall 61 includes a window 62 of limited circumferential extent. The window is formed of a material which is translucent or transparent through which infrared signals can pass. The window has a triangular configuration and is arranged with respect to the upper section 40a of the lower housing member 40 so that, in cooperation with the key and keyway, the circumferential extremities 62a, 62b of the window can be located in front of the photodiode "eye".

The sensor assembly 100 is disposed between the upper and lower sections 20 and 40 of the adapter assembly. A first pair of leads 72, 72' extends from one portion of the assembly 100, and a second pair of leads 74, 74' extends from the opposite lower portion of the asembly 100. The leads of the sensor assembly electrically connect the upper and lower housing members 20 and 40 of the adapter assembly. As shown in FIG. 2, lead 72 is adapted to be secured in the central contact 28, lead 72' is adapted to be secured in one of the other contacts 27 or 27', lead 74 is adapted to be secured in the central contact 48, and lead 74' is adapted to be secured in one of the contacts 46, 46'. Preferably the leads are secured in their respective contacts in a well-known manner, as for example, by soldering or welding.

The sensor assembly 100, shown in detail in FIGS. 6–8, includes a motherboard 102 on which is mounted an EMI box 103, a power reduction resistor 106, a first diode 107, a capacitor 108, and a triac 150. A sensor subassembly 160 in the EMI box includes a printed circuit board 162 bearing a photo diode 164 on one side thereof, and an ASIC 166 (i.e., an Application Specific Integrated Circuit) on the opposite side thereof.

The photodiode 164 is mounted in the EMI box 103 so that when the sensor assembly is properly positioned in the lower section 40b of the adapter, its "eye" 165 sits at a height that places it at a window 104 formed in a wall 105 of the EMI box 103.

FIG. 9 is a circuit diagram of the ASIC 166 shown in FIGS. 7 and 8. Household current (110 v AC) first passes through a fuse wire 201 which is designed to automatically open if there is current in excess of about 5 mA. The fuse wire 201 is electrically connected to the diode 107. The diode only passes the positive phase of the AC power cycle.

The diode is electrically connected to the power reduction resistor 106. The resistor is of large enough value to reduce the AC power to a safe range. The output of the power reduction resistor 106 is electrically connected to a filter capacitor 108. The junction of the filter capacitor and the output of the power reduction resistor is electrically connected to a voltage regulator 110, the output of which is 6.7 v DC.

A typical IR transmitter emits infrared energy in the form of a pulse modulated carrier. The position of the pulses in the carrier determines if the command is to lower the volume or to change the channel. The adapter assembly of the present invention recognizes only the carrier frequency, not the pulses.

Photodiode 164 detects light in the infrared spectrum. An infrared signal typically has a strength of about 25–50 microvolts. This tiny signal would normally be lost in ambient light. The infrared-sensitive "eye" 165 of the photodiode, protected by being recessed within the EMI box 103, "looks" through a window 104 in the box. The box thus protects the photodiode "eye" from direct light that is produced when the adapter has been activated and the light bulb has been turned on.

The photodiode (or other similar light-sensitive devices) is electrically connected to a high gain amplifier 114 through a capacitor 113. The capacitor 113 passes higher frequencies and blocks the lower frequencies such as ambient incandescent light or fluorescent light. The amplifier 114 is a high gain front end amplifier that provides a gain of about 96 db. The input signal is therefore amplified by a factor of about 70,000, and the output of the high gain amplifier is 3.5 v peak to peak.

The output of the high gain amplifier is connected to a band pass filter 116, which passes only the amplified input signals that are centered around the carrier frequencies emitted from the transmitter. A low pass capacitor 118 and a high pass capacitor 120 respectively define lower and upper frequency limits for signals which will be passed through the band pass filter 116.

The output of the band pass filter 116 is connected to comparator 122. The comparator 122 only produces an output signal when the input signal crosses a preset threshold which is measured or determined by the reference voltage VR at junction 124. The threshold value is typically −3 db from the top of the peak output of the band pass filter 116.

The output of the comparator 122 is coupled to an integrator 126. The capacitor 128 is charged via the pulses from the comparator 122. The output of the integrator 126 climbs as the charge on the capacitor 128 increases due to the number of pulses that have passed through the comparator 122.

The output of the integrator 126 is connected to a level comparator 130. When the output of the integrator 126 reaches an externally adjusted threshold of the comparator, a short pulse or signal is produced.

The output of the comparator 130 is connected to a toggle flip flop 140 which changes state every time a pulse is produced by the comparator 130. When the toggle flip flop changes state, the triac switch 150 is activated. The "POWER ON" reset component 400 insures that when power is applied to the circuit, the flip flop 140 starts in the high state.

The entire sensor circuit including the ASIC is housed in an electrically conductive shield or EMI box 82 which prevents spurious RF signals from interfering with the operation of the receiver unit.

Referring once again to FIG. 2, the following is a discussion of the function of the annular member 60 and the window 62.

Due to the wide variety of IR remote control transmitters, the output power difference from tranmitter to transmitter must be taken into account. Some tranmitters emit a powerful, wide dispersion beam while others emit a directional, narrow, low power beam.

The sensitivity of the present invention to IR transmitters of both high and low power is unique because it can be adjusted to accomodate the particular type of transmitter being used. If the apparatus of the present invention were too sensitive (i.e., designed for use with a low power transmitter), the IR beams of the powerful transmitters would reflect off the walls, ceiling and carpet in the room, and the reflected beam signals would cause activation of the switch of the invention. On the other hand, if the apparatus of the present invention were not sensitive enough, signals from a weaker transmitter would not operate the apparatus of the invention at a reasonable range.

One solution to this dilemma is provided by the window 62. Due to the configuration of the window, rotation of the annular member 60 about the adapter axis L—L will enable adjustment of the sensitivity of the invention to the wide variety of transmitter signal strengths.

In a first extreme position of the annular member 60, the narrow end of the window 62 is positioned in front of the photodiode "eye" 65. In this first position, the "eye" is effectively closed down to allow only a minimum amount of light in.

In the other extreme position of the annular member 60, the widest end of the window 62 is positioned in front of the photodiode "eye". In this position, the "eye" has been effectively fully opened to allow the maximum amount of light in.

Between these two extreme positions are an infinite number of intermediate positions which enable a vast number of adjustment positions thereby facilitating optimum performance of the inventive apparatus with whatever transmitter is being used.

Moreover, the inventor has discovered that different lampshades will also affect the performance of the inventive apparatus. For example, some lampshades function as if they are transparent to IR signals, while other shades function as if they are opaque.

The adjustability afforded by the window 62 of the present invention, as described above, allows the user to increase the sensitivity of the inventive apparatus to match the lampshade reflectivity characteristics as well as the power of the transmitter. In this way, the apparatus of the present invention can be adjusted to work effectively and equally well with a dark, double pleated, plastic lampshade (effectively "opaque" to IR signals), and a white silk lampshade (effectively "transparent" to IR signals).

The inventor has also found that, by mounting a screen (not shown) over or directly in front of the window 104 of the EMI box 103 in front of the photodiode "eye", spurious signals can be significantly reduced. Preferably, the screen comprises a sheet of metal having an array of evenly, but densely, distributed tiny holes or perforations therein.

The addition of the screen is not critical to operation of the invention, but its addition does appear to increase the efficiency of the inventive apparatus.

The present invention is not to be limited to controlling a light through the use of a triac. In a second application, the triac switch can be replaced with a mechanical switch for physically moving the wall switch armature from the "on" position to the "off" position. The mechanical actuator will move the switch armature in 180 degree movements to effect switch "on" and switch "off" positions.

In the context of this additional application, the present invention contemplates that the wall switch mechanism will physically replace the wall switch face plate. The new wall switch face plate will contain the IR receiver, motor and cam mechanism. The cam mechanism will be activated by the IR carrier signal. Each IR signal causes the cam to rotate 180 degrees. The rotating cam physically moves the existing wall switch armature from the "ON" position to the "OFF" position. The econd IR signal moves the armature back to the "ON" position.

While the present invention has been described in conjunction with specific embodiments thereof, it is evident that many alternatives, modifications, and variations will be apparent to those skilled in the art in light of the foregoing description. Accordingly, the present invention is intended to embrace all alternatives, modifications, and variations which fall within the spirit and scope of the appended claims.

What I claim is:

1. A remotely-controlled, infrared-sensitive, switching apparatus for selectively activating an appliance in response to signals emitted from a source of infrared signals, such as conventional, infrared remote control appliance transmitters, said switching apparatus comprising:

a housing having first circuit means for electrical connection with a power source and second circuit means for electrical connection with the appliance, switching circuit means electrically interposed between said first and second circuit means including infrared signal sensing means for sensing infrared signals emitted from said source, means for filtering spurious ambient light signals from said infrared transmitter-emitted signals, and switch means for electrically powering said appliance, and window means, movably mounted on said housing and disposed between said infrared signal source and said infrared signal sensing means, for altering sensitivity of said of said infrared signal sensing means in different "noise" environments.

2. The switching apparatus of claim 1, wherein said infrared signal sensing means comprises an infrared-sensitive photodiode, and said filtering means comprises a band pass filter and means for converting filtered signals to selective switching signals.

3. The switching apparatus of claim 2, and further including signal amplifying means and printed circuit means for functionally interconnecting said photodiode, said signal amplifying means, said filtering means and said means for converting said filtered signals to selective switching signals.

4. The switching device of claim 3, wherein said housing includes first female portion having an interior portion configured for receipt of a conventional light bulb, a second male portion having an exterior portion configured for insertion into a conventional lamp socket, and contact means carried by said first and second portions for electrically interconnecting said switching circuit means with the light bulb and the lamp socket.

5. The switching apparatus of claim 4, wherein said window means comprises an opening and shielding means covering said window means to reduce spurious signals.

6. The switching device of claim 5, wherein said window means further comprises means for adjustably controlling the amount of signals admitted to said photodiode.

7. The switching device of claim 6, wherein said third portion comprises a substantially opaque material, and said means for adjustably controlling the amount of signals admitted to said photodiode comprises a triangular transparent area on said third portion.

8. The switching device of claim 5, wherein said window means further comprises screen means disposed in front of said photodiode for further reducing spurious signals.

9. The switching device of claim 8, wherein said screen means comprises a metal member having an array of evenly spaced, small openings therein.

10. A remotely-controlled, infrared-sensitive, switching apparatus for selectively switching an electric appliance between "activated" and "deactivated" states in response to signals emitted from a source of infrared signals, such as a hand-held infrared remote control transmitter used to control televisions, VCRs, and other household appliances, said switching apparatus being operational in different "noise" environments and comprising:

a housing containing
       first circuit means for electrical connection with a power source, a second circuit means for electrical connection with the appliance, and switching circuit means electrically interposed between said first and second circuit means and including infrared signal sensing means for sensing infrared signals emitted from said source, and switch means for activating or deactivating said appliance, and sensitivity adjustment means movably supported on said housing and disposed between said infrared signal sensing means and said source for altering sensitivity of said sensing means in said different "noise" environments.

11. The switching apparatus of claim 10, wherein said sensitivity adjustment means comprises a triangular window and means for positioning different portions of said window between said source and said sensing means.

12. The apparatus of claim 11, wherein said housing includes a cylindrical portion and said sensitivity adjustment means comprises a collar is rotatable on said cylindrical portion.

13. The apparatus of claim 12, wherein said collar is opaque and said window comprises a transparent portion of said collar.

14. The apparatus of claim 10, wherein said sensitivity adjustment means comprises a collar mounted for rotation about a portion of said housing adjacent said infrared signal sensing means, said collar including a transparent portion configured for disposition between said signal sensing means and said source.

15. The apparatus of claim 14, wherein said transparent portion has the shape of an acute triangle.

16. The apparatus of claim 10, wherein said sensitivity adjustement means comprises a rotatable member having a portion located adjacent said infrared signal sensing means, and including a slot having opposing ends of different lengths and non-parallel sides.

\* \* \* \* \*